INVENTOR
DONALD G. LUDLUM

BY Arnold & Roylance
ATTORNEY

United States Patent Office 3,487,322

Patented Dec. 30, 1969

3,487,322

HIGH GAIN LOW VOLTAGE AMPLIFIER

Donald G. Ludlum, Sweetwater, Tex., assignor to Ludlum Measurements, Inc., Sweetwater, Tex., a corporation of Texas Filed Sept. 16, 1965, Ser. No. 487,719
Int. Cl. H03f 3/04, 3/68
U.S. Cl. 330—22 10 Claims

ABSTRACT OF THE DISCLOSURE

In one exemplary embodiment, a solid state amplifier circuit providing high gain and wide band frequency characteristics with a limited voltage source employing a common emitter transistor amplifier circuit having a collector load impedance that maintains a temperature-independent constant current in the amplifier output stage. A negative feedback loop provides additional stability for the transistor amplifier circuit.

This invention relates to amplifier circuits and more particularly to amplifier circuits embodying solid state devices and characterized by high gain and wide band frequency response with limited voltage source.

In portable instruments, micro-logic circuits and other applications, it is desirable to provide an amplifier which has a high gain, and a constant gain over a wide band of frequencies. It is also desirable to operate such amplifiers from a low voltage limited value power source of, for example, 2 to 3 volts DC, typically two or more batteries. However, certain inherent characteristics of transistors have forced prior art workers in this field to choose between the desired characteristics and to necessarily compromise these desired results.

In general, multistage amplifiers are designed to have a relatively small voltage swing throughout the earlier stages, and a larger amplification in the final stage. A conventional amplifier can be so designed as to have a constant gain over a bandwidth of as much as two to five megacycles per second (mc./s.). However, to attain constant gain over a bandwidth of, for example, 100 mc./s., other techniques must be employed because transistor delay time at high frequencies causes the frequency response to degenerate rapidly. To obtain constant gain over a wide bandwidth, it is necessary to use negative feedback and in order to use negative feedback, the basic amplifier must be designed with a very high open loop voltage gain.

A common emitter circuit is well recognized to be a basic configuration usable to achieve a gain greater than unity. For a single stage of amplification, using a common emitter circuit, the voltage gain can be estimated by dividing the load resistance by the parameter $h_{ib}$, $h_{ib}$ being a transistor parameter approximately equal to a constant, determined by the particular transistor to be used, divided by the collector current. Thus, the voltage gain is approximately equal to $$(R_L)\ (I_c)/K$$

where $I_c$ is collector current, K is the aforementioned constant, and $R_L$ is the load resistance.

With a predetermined supply voltage, changes in the load resistance will result in opposite changes in collector current, resulting in a substantially constant product in the numerator of the above equation. Thus changes in gain cannot be obtained by changing load resistance. This can be illustrated by selecting numerical values for a typical transistor, i.e., a type 2N414, for which the constant K is 28. With a load resistance of 10,000 ohms, and a 3 volt DC supply, the collector current will be about 0.2 ma. Substituting in the above equation, the gain will be seen to be about 71.4. Decreasing the load resistance to 1000 ohms with the same supply voltage will cause an increase of collector current to about 2.0 ma., again resulting in a gain of 71.4. This is clearly an unprofitable approach to obtaining the necessary high open loop gain.

An additional problem is presented in the case of DC amplifiers, in that changes in ambient and junction temperature produce changes in output voltage with no change of input voltage. This phenomenon is much more noticeable in a DC amplifier, and, therefore, more of a problem. The gain problems discussed above are the same, in that a very high open loop gain is necessary before it is possible to add sufficient negative feedback to provide a fully stabilized system.

For a more complete analytical discussion of the problems, reference is made to the texts Electronic Analog and Hybrid Computers, by Granino A. and Theresa M. Korn, McGraw-Hill Publishing Co., New York (1964), and Electronic Analog Computers (1952) by the same authors, and also to the General Electronic Transistor Manual, 6th edition (1962), especially p. 113.

It is, therefore, an object of the present invention to provide amplifying apparatus capable of amplifying an electrical signal by a constant factor where the signal is variable over a wide range of frequencies.

A further object is to provide semiconductor amplifying apparatus having constant high gain over a wide bandwidth where the apparatus is provided with a limited voltage magnitude power supply.

Another object is to provide a transistorized amplifying apparatus for wide bandwidth amplification wherein the collector current is provided from a constant current generator.

Yet another objet is to provide a transistorized amplifier capable of accepting electrical signals within a wide frequency spectrum and amplifying all such signals by a constant factor wherein the load impedance for the amplifier is a constant current load.

A still further object is to provide an amplifier apparatus which has a high open loop gain, is stabilized in its amplification characteristics by negative feedback, and is compensated to prevent changes in output signal from occurring as a result of temperature changes when there is no change in input signal.

Briefly described, a preferred embodiment of the subject invention includes one or more amplification stages, each such stage including at least one transistor, at least one such stage being provided with a load the effective voltage of which varies as the circuit characteristics change so as to maintain a constant current in the output of that stage. Using a common emitter circuit configuration, the constant current is in the collector circuit. Referring to the equation set forth above, it will be seen that, if the collector current is held constant, the open loop voltage gain will vary in direct proportion to the load resistance, and will be independent of the value of supply voltage so long as that supply voltage value exceeds the biasing and voltage swing requirements of the system. Negative feedback can then be applied to stabilize the circuit, thereby obtaining the desired high gain and wide bandwidth without having to increase the supply voltage.

In the DC amplifier configuration, diodes having the same junction characteristics as the transistors used in the amplifier are added to the input base circuit to compensate for changes in junction voltage drop due to temperature changes. This is in addition to the constant current load in the collector circuit of one stage, and to the negative feedback circuit.

In order that the manner in which the foregoing and other objects are attained in accordance with the invention can be understood in detail, particularly advantageous embodiments thereof will be described with reference to the accompanying drawings, which form a part of this specification and wherein.

Figures 1, 2:
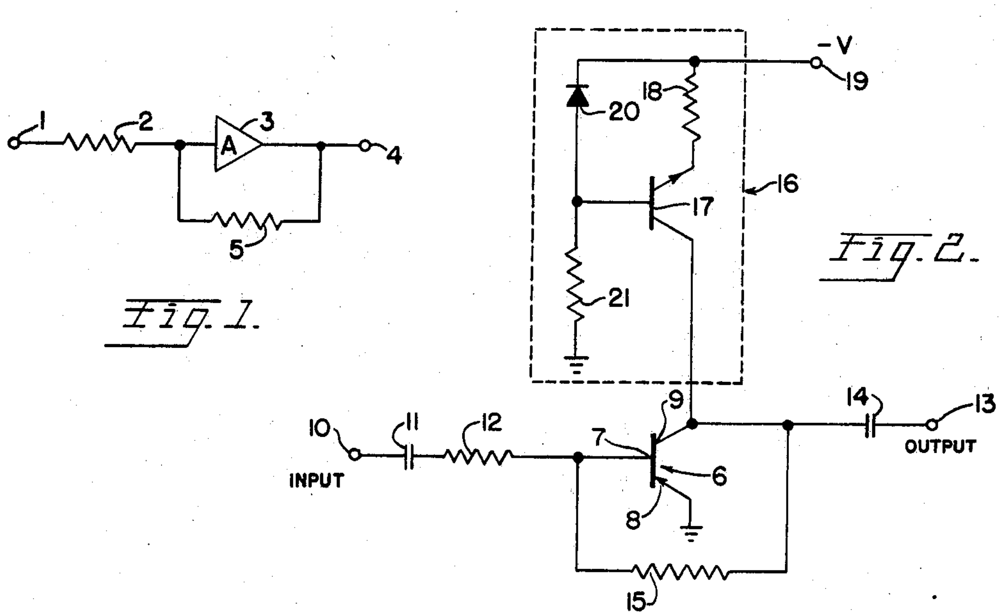
FIG. 1 is a schematic diagram of a basic operational feedback amplifier to which the present invention can be applied.
FIG. 2 is a schematic diagram of a single stage amplifier incorporating the concept of the subject invention.

Referring now to the drawings, it will be seen that FIG. 1 illustrates a basic operational amplifier in which an input terminal 1 is connected by an input resistance 2 to the input of the amplifier itself, indicated at 3. The output of the amplifier is provided at an output terminal 4. Because of the stability requirements of an amplifier of this type, negative feedback is provided by a negative feedback circuit indicated in FIG. 1 as a resistance 5. The relationships governing the operation of this type of circuit are fully discussed in the abovementioned text by Korn and Korn. As set forth therein, if the open loop gain $-A$ is large, the output voltage will then be equal to the negative of the input voltage multiplied by the ratio of the values of the feedback resistance to the input resistance, i.e., $$V_{out}=V_{in}\frac{R_5}{R_2}$$

This relationship is applicable to the circuits discussed herein, with slight modification.

The basic circuit illustrating the concept of the present invention is shown in FIG. 2, in which a PNP type transistor, indicated generally at 6 and having a base electrode 7, an emitter electrode 8 and a collector electrode 9, is supplied with input signals applied to an input terminal 10 via a coupling capacitor 11 and an input resistance 12. The emitter electrode 8 is connected to a point of reference potential indicated by the conventional ground symbol, and the collector electrode is connected to an output terminal 13 by a coupling capacitor 14. A feedback resistance 15 is connected between the collector and base electrodes of transistor 6.

The load impedance for the collector circuit of transistor 6 is a constant current circuit indicated generally at 16, enclosed, in FIG. 2, within dotted lines. Constant current generator 16 includes an NPN type transistor 17, having a base electrode, an emitter electrode, and a collector electrode. The collector electrode of transistor 17 is connected to the collector 9 of transistor 6, and the emitter electrode of transistor 17 is connected via a resistor 18 to a DC supply terminal 19, and to the cathode of semiconductor diode 20. The anode of diode 20 is connected to the base of transistor 17, and to one terminal of a resistor 21, the other terminal of which is connected to ground.

The operation of the constant current circuit 16 begins with the initiation of some current flow from the collector 9 of transistor 7 through transistor 17 and resistor 18 to the negative DC supply terminal 19. Resistor 18 is the most influential element determining the level of current flow in the collector circuit, and is selected to establish a desired current flow level. At that current level, a particular voltage drop will occur across resistor 18. Similarly, a particular voltage drop will appear across diode 20, and also across the base-emitter junction of transistor 17 in accordance with the inherent characteristics of those devices. An increase in the collector current of transistor 6 and transistor 17 will result in a larger voltage drop across resistor 18. This increase in voltage is fed back through diode 20 to decrease the emitter-base voltage of transistor 17, thereby decreasing the conductivity of transistor 17 and decreasing the current allowed to flow through its collector-emitter circuit, resulting in a substantially constant current therethrough.

For this purpose, diode 20 could be any closely calibrated impedance element. However, a semiconductor diode is selected because of the magnitude of voltage drop across a diode junction and because of the temperature characteristics thereof. As is well known, a diode exhibits an impedance change with temperature similar to the impedance change in a transistor base-emitter junction. When the diode is placed in parallel with the base-emitter junction of a transistor in proper polarity relationship, junction temperature changes in the transistor occurring due to current flow or to ambient temperature variations will therefore be compensated for by the diode action.

Transistor 17 is advantageously selected to be a germanium transistor having a voltage drop at the base-emitter junction of approximately 0.2 volt and a temperature response characteristic of approximately 2 millivolts per degree centigrade. Diode 20 can then be a silicon diode having a junction voltage drop of approximately 0.5 volt and a temperature characteristic similar to that of the transistor. Resistor 21 is selected to bias transistor 17, causing it to operate in that portion of its characteristic curves wherein current variation with changes in operating voltage is least; i.e., that portion above the "knee" of the characteristic curve. Thus, circuit 16 maintains constant current flow over a wide variation of collector voltages and temperature variations.

As indicated above, the insertion of the constant current circuit 16 as the load element for the circuit including transistor 6 allows transistor 6 to have an extremely high open loop gain, being in the neighborhood of 1700 with a 4 milliampere collector current and a supply voltage at terminal 19 of approximately $-3$ volts. Without the constant current circuit, it would be necessary to provide a supply voltage of approximately 50 volts to obtain the same gain. Furthermore, without the constant current circuit, if a feedback voltage of approximately 6 volts were provided to maintain stability, it would be necessary to increase the supply voltage still further. With feedback, the circuit of FIG. 2 can provide an overall gain of approximately 40 with extremely good stability despite variations in frequency, temperature, voltage variation and output circuit impedance.

Figure 3:
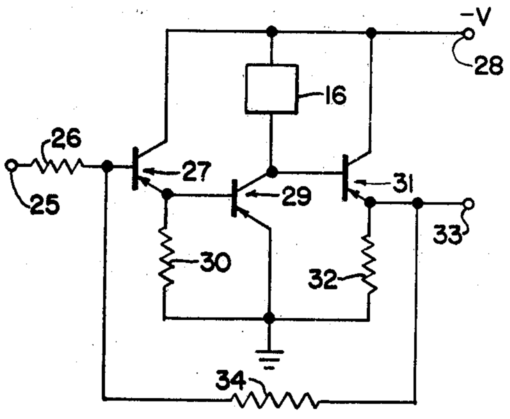
FIG. 3 is a schematic diagram of a multi-stage amplifier incorporating the present invention.

A more sophisticated and more widely applicable circuit is shown in FIG. 3 wherein three stages are employed to provide proper phase shift. In FIG. 3, an input terminal 25 is connected to one terminal of a series input resistance 26 which is connected to the base of a PNP type transistor indicated generally at 27, the collector of which is connected to a D.C. supply terminal 28. The emitter electrode of transistor 27 is connected to the base electrode of a PNP type transistor indicated generally at 29, and is also connected to one terminal of an emitter resistor 30, the other terminal of which is connected to ground. The emitter electrode of transistor 29 is connected to ground, and the collector electrode is connected to the input terminal of a constant current circuit 16, in the manner of transistor 6 in FIG. 2. The collector of transistor 29 is also connected to the base electrode of a third PNP type transistor indicated generally at 31, the collector electrode of transistor 31 being connected to D.C. supply terminal 28, and the emitter electrode being connected to one terminal of an emitter resistor 32, the other terminal of which is connected to ground. The emitter of transistor 31 is also connected to an output terminal 33, and to one terminal of a feedback resistor 34, the other terminal of which is connected to the base electrode of transistor 27.

Resistor 30 is selected to bias transistor 27 to the desired operating region of its characteristic curves, and to provide sufficient collector current for transistor 27 and sufficient base current for transistor 29 to place these transistors in the desired operating regions. These stages including transistors 27 and 31 are primarily impedance matching and isolation stages to allow the operation of the amplification stage including transistor 29 to be as completely independent from external influences as possible. Feedback resistor 34 is provided as above to stabilize the amplifier operation, and to spread and stabilize the amplifier bandwidth. The circuit including transistor 27, operating as an emitter follower circuit, provides an output voltage at its emitter as developed across resistor 30, this voltage being the input signal to transistor 29. Transistor 29 operates substantially as described with reference to FIG. 2, having a constant collector current and a substantially constant collector load impedance, and therefore a high gain established in accordance with the particular emitter resistor selected for the transistor within constant current circuit 16. The output signal at the collector of transistor 29 is provided at the base of transistor 31, the circuit including transistor 31 also operating as an emitter follower circuit, providing the output signal as developed across resistor 32 at output terminal 33. Once again, high gain is provided with a minimal collector voltage, typically on the order of negative 3 volts.

As will be recognized by those skilled in the art, the PNP transistors shown as transistors 27, 29 and 31 can be replaced by equivalent devices of the opposite conductivity type, using the wide variety of commercially available semiconductor amplifying devices now on the market.

Figure 4:
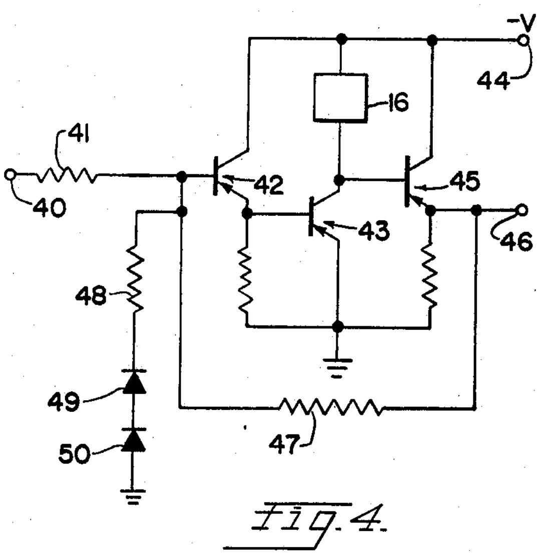
FIG. 4 is a schematic diagram of a third embodiment of the subject invention for amplification of DC signals and having temperature compensation.

Referring now to FIG. 4, it will be seen that a slightly modified amplifier circuit is provided especially for the amplification of D.C. signals. In FIG. 4, an input terminal 40 is connected to one terminal of an input resistance 41, the other terminal of which is connected to the base of a transistor indicated generally at 42. Transistor 42 is connected in common emitter configuration, the emitter electrode of transistor 42 being connected to the base of a PNP transistor indicated generally at 43. The collector electrode of transistor 43 is connected via constant current circuit 16, to negative D.C. supply terminal 44. Constant current circuit 16 is advantageously the same circuit as circuit 16 illustrated in FIG. 2. The collector electrode of transistor 43 is also connected to the base electrode of a PNP transistor 45, which is connected to function as an emitter follower. The emitter electrode of transistor 45 provides an output signal to an output terminal 46, and is also connected to one terminal of a feedback resistance 47, the other terminal of which is connected to the base electrode of transistor 42. The circuit of FIG. 4 thus far described is substantially identical to the circuit of FIG. 3. The significant addition is a series circuit connected between the input circuit at the base of transistor 42 and ground, this series circuit including a resistance 48 and two semiconductor diodes 49 and 50. The cathode of diode 50 is connected to the anode of diode 49, the anode of diode 50 being connected to ground, and the cathode of diode 49 being connected to resistance 48.

As will be recognized by one skilled in the art, a common problem in direct current amplifiers is that of temperature stability. When the input signal provided to terminal 40 does not change, the output signal at 46 also should not change. However, with current flow and changes in ambient temperature both causing changes in junction temperature of transistors 42 and 43, especially the base-emitter junctions of those transistors, the voltages across those junctions will change, causing a change in the output signal. To be more specific, the output voltage appearing at terminal 46 can be mathematically represented as the sum of 4 terms, $$\left[\left(-V_{\text{in}}\frac{R}{R_{\text{in}}}\right)+V_{\text{be}_1}+V_{\text{be}_2}+I_{\text{b}_1}R\right]$$

where $V_{in}$ is the input voltage, R represents the value of the feedback resistance 47, $R_{in}$ is represented by the series resistance 41 in the input circuit, $V_{be_1}$ and $V_{be_2}$ are the base-emitter voltages of transistors 42 and 43, respectively, and $I_{b_1}$ is the base current of transistor 42. The sum of these voltages will equal the voltage output. Transistor characteristics are such that the base-emitter voltages of each of transistors 42 and 43 will vary at approximately 2 millivolts per degree centigrade, as mentioned above. The sum of the two voltage drops is therefore approximately 4 millivolts per degree centigrade. Thus, with no input signal variation, and with a temperature change of N° C., the output voltage will change by 4 N millivolts.

To avoid this undesirable circumstance, the series circuit including resistance 48 and diodes 49 and 50 is connected to the input signal circuit.

As will be obvious to one skilled in the art, to render the last mentioned expression for $V_{out}$ independent of temperature, one must eliminate the terms $V_{be_1}$ and $V_{be_2}$ therefrom. To make that expression correct for the circuit of FIG. 4, one must add the effect of temperature on the voltage drop across diodes 49 and 50. That voltage drop is equal to $$(V_{\text{D}_1}+V_{\text{D}_2})\frac{R}{R_{\text{in}}}$$

where $V_{D_1}$ and $V_{D_2}$ are the voltages across diodes 49 and 50, but the term is of opposite sign to that of the other terms in the expression because of the polarization of the diodes. For full compensation $$V_{\text{be}_1}+V_{\text{be}_2}-(V_{\text{D}_1}+V_{\text{D}_2})\frac{R}{R_{\text{m}}}=0$$

If diodes 49 and 50 are selected to have substantially the same voltage-temperature characteristics as the base-emitter junctions of transistors 42 and 43, and if resistance 48 is selected to be approximately equal to feedback resistance 47, it will be seen that the base-emitter voltage changes due to temperature will be substantially eliminated, and that the output voltage will no longer vary as a function of temperature. Thus, a completely stable, high gain, fast response DC amplifier is provided. Once again, the supply voltage need only be a very small voltage, such as −3 volts, for the reasons described with reference to FIGS. 2 and 3, without diminishing the gain characteristics and response time characteristics of the circuit.

Figure 5:
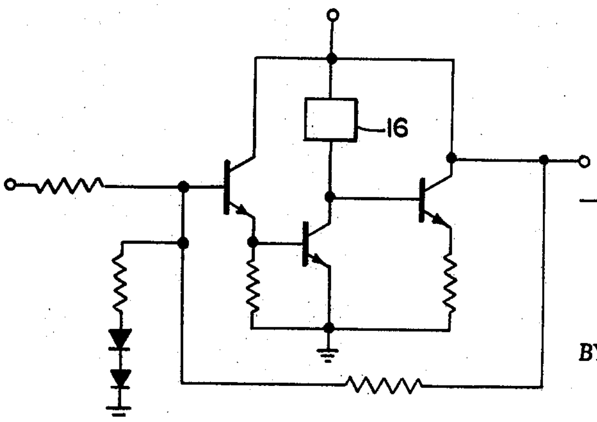
FIG. 5 is a schematic diagram of another embodiment adapted to provide temperature compensated DC amplification, using transistors of the polarity type opposite to FIG. 4.

FIG. 5 shows a DC amplifier having substantially the same configuration as that of FIG. 4, but using NPN transistors rather than PNP resistors to obtain a positive voltage swing. The same basic modification can clearly be made in the circuit of FIG. 3, without requiring any additional experimentation or innovation, by merely reversing the voltage supply and the appropriate semiconductors. Note that, in FIG. 5, with NPN transistors, the diodes in the temperature compensation circuit are connected with their cathodes toward ground to provide the desired compensation feature. No further discussion of the circuit of FIG. 5 is deemed necessary, as the operation is substantially identical to that described above except for reversal of current flow.

While certain advantageous embodiments have been chosen to illustrate the invention, it will be understood by those skilled in the art that various other changes and modifications can be made therein without departing from the scope of the invention as defined in the appended claims.

What is claimed is:

1. Amplifying apparatus comprising an input terminal connectible to a source of electrical signals;

an output terminal;

a supply terminal connectible to a source of direct voltage;

a first transistor having a base electrode, an emitter electrode and a collector electrode, said collector electrode being connected to said supply terminal;

a first resistance interconnecting said input terminal and said base electrode of said first transistor;

a second resistance interconnecting said emitter electrode of said first transistor and a point of reference potential;

a second transistor having a base electrode, a collector electrode, and an emitter electrode, said base electrode of said second transistor being connected to said emitter electrode of said first transistor, said emitter electrode being connected to a point of reference potential;

constant current generator means connected between said collector electrode of said second transistor and said supply terminal for maintaining a predetermined magnitude of current flow through the circuit including said collector electrode of said second transistor;

a third transistor having a base electrode, an emitter electrode and a collector electrode, said base electrode of said third transistor being connected to said collector electrode of said second transistor, said collector electrode of said third transistor being connected to said supply terminal, and said emitter electrode being connected to said output terminal;

a third resistance connected between said emitter electrode of said third transistor and said base electrode of said first transistor to provide a negative feedback circuit; and a fourth resistance connected between said emitter electrode of said third transistor and a point of reference potential.

2. Apparatus according to claim 1, wherein said constant current generator means comprises an electron valve having a control electrode and two other electrodes;

circuit means interconnecting one of said two other electrodes to said supply terminal and the other electrode to said collector electrode of said second transistor;

a semiconductor diode;

a resistance element;

a series circuit including said diode and said resistance connected between said supply terminal and a point of reference potential; and circuit means interconnecting said control electrode of said electron valve and a point in said series circuit between said diode and said resistance.

3. Apparatus according to claim 1, and further comprising voltage stabilizing means interconnecting said control electrode and a point of reference potential for compensating for voltage changes in said electron valve due to changes in temperature.

4. In an apparatus for amplifying variable DC voltages, the combination comprising an input terminal to which the source of variable DC voltage can be connected;

a first semiconductor electron valve having a first electrode, a second electrode and a control electrode;

first resistance means interconnecting said second electrode of said first valve and a point of reference potential;

resistance means interconnecting said input terminal and said control electrode of said first valve;

a supply terminal to which the low voltage source of DC voltage can be connected;

circuit means interconnecting said supply terminal and said first electrode of said first valve;

a second semiconductor electron valve having a first electrode, a second electrode and a control electrode, said second electrode of said second valve being connected to a point of reference potential, and said control electrode of said second valve being connected to said second electrode of said first valve;

constant current load means interconnecting said first electrode of said second valve and said supply terminal for maintaining a predetermined magnitude of current flow through the circuit including said first electrode of said second valve;

a third semiconductor electron valve having a first electrode, a second electrode and a control electrode, said control electrode of said third valve being connected to said first electrode of said second valve, and said first electrode of said third valve being connected to said supply terminal;

an output terminal;

circuit means interconnecting said iutput terminal and said second electrode of said third valve;

third resistance means interconnecting said second electrode of said third valve and a point of reference potential;

feedback resistance means for providing a negative feedback signal from said second electrode of said third valve to said control electrode of said first valve; and voltage stabilizing means interconnecting said control electrode of said first valve and a point of reference potential for compensating for voltage variations due to temperature changes of said valve, comprising a resistance, and at least one semiconductor diode in series circuit relationship with said resistance.

5. Apparatus according to claim 4, wherein each of said first, second and third electron valves is a PNP type transistor, said second transistor being connected in common emitter configuration; and said semiconductor diode is oriented with the cathode thereof connected nearest said control electrode of said first transistor.

6. Apparatus according to claim 4, wherein each of said first, second and third electron valves is an NPN type transistor, said second transistor being connected in common emitter configuration; and said semiconductor diode is oriented with its anode connected nearest said control electrode of said first transistor.

7. In a temperature compensated, high gain amplifier apparatus, the combination of an input terminal connectible to a source of input signals;

an output terminal;

a supply terminal connectible to a source of low voltage;

a first transistor having a base electrode, an emitter electrode and a collector electrode and connected to operate as an emitter follower;

input circuit means for coupling input signals from said input terminal to the base of said first transistor;

a second transistor having a base electrode, an emitter electrode and a collector electrode connected in common emitter configuration, said base electrode of said second transistor being connected to said emitter electrode of said first transistor;

a third transistor having a base electrode, an emitter electrode and a collector electrode connected to operate as an emitter follower, said base electrode of said third transistor being connected to said collector electrode of said second transistor, and said emitter electrode of said third transistor being connected to said output terminal;

each of said transistors being characterized by changes in base-emitter voltage with changes in junction temperature;

constant current circuit means connected in series with the collector electrode of said second transistor for maintaining a predetermined magnitude of current flow through the circuit including said collector electrode of said second transistor;

feedback circuit means for providing a negative feedback voltage from said output terminal to said input circuit means; and voltage stabilizing circuit means comprising a series circuit including a resistor and at least one semiconductor diode connected between said base electrode of said first transistor and a point of reference potential, said at least one diode being characterized by junction voltage changes corresponding to temperature changes substantially like such changes in each of said transistors.

8. Apparatus according to claim 7, wherein said constant current circuit means further comprises a fourth transistor having a base electrode, an emitter electrode and a collector electrode, said collector of said fourth transistor being connected to said collector of said second transistor;

a first resistor interconnecting said emitter electrode of said fourth transistor and said supply terminal; and a series circuit including an asymmetrically conductive device and a second resistor connected between said supply terminal and a point of reference potential, said base electrode of said fourth transistor being connected to the junction of said second resistor and said asymmetrically conductive device.

9. A wide-bandwidth, high-gain amplifying apparatus comprising an odd number of PNP type transistors, each having a base electrode, an emitter electrode and a collector electrode, at least one of said transistors being connected in common emitter configuration;

an input terminal to which a source of electrical signals can be connected;

input circuit means interconnecting said input terminal and said base electrode of a first one of said transistors;

coupling circuit means interconnecting said transistors to form a multi-stage amplifying apparatus;

an output terminal;

output circuit means interconnecting said output terminal and the emitter electrode of the last one of said transistors;

feedback circuit means interconnecting said output circuit means and said input circuit means for providing a negative feedback signal;

a supply terminal connectible to a source of DC voltage; and load means connected between said supply terminal and said collector electrode of said intermediate one of said transistors connected in said common emitter configuration, said load means being capable of maintaining a predetermined flow of current therethrough when said supply terminal is connected to said DC voltage source and said input terminal is provided with electrical signals.

10. An apparatus according to claim 9 and wherein said load means further comprises an NPN type transistor having a base electrode, a collector electrode and an emitter electrode, said collector electrode of said NPN transistor being connected to said collector electrode of said intermediate transistor;

a resistance interconnecting said emitter electrode of said NPN transistor and said supply electrode; and a series circuit including a resistance and a semiconductor diode connected between said supply terminal and a point of reference potential;

said base electrode of said NPN transistor being connected to the junction of said resistance and said diode in said series circuit.

References Cited

UNITED STATES PATENTS

| | | | |
|---|---|---|---|
| 3,290,520 | 12/1966 | Wennik | 330—30 X |
| 3,009,113 | 11/1961 | Stanton | 330—22 X |
| 3,310,688 | 3/1967 | Ditkofsky | 330—69 X |

ROY LAKE, Primary Examiner

LAWRENCE J. DAHL, Assistant Examiner

U.S. Cl. X.R.

330—28